United States Patent
Shin

(10) Patent No.: US 11,521,991 B2
(45) Date of Patent: Dec. 6, 2022

(54) DISPLAY MODULE AND MOBILE TERMINAL

(71) Applicant: LG ELECTRONICS INC., Seoul (KR)

(72) Inventor: Kyushik Shin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/309,851

(22) PCT Filed: Jan. 28, 2019

(86) PCT No.: PCT/KR2019/001162
§ 371 (c)(1),
(2) Date: Jun. 23, 2021

(87) PCT Pub. No.: WO2020/158962
PCT Pub. Date: Aug. 6, 2020

(65) Prior Publication Data
US 2022/0077193 A1     Mar. 10, 2022

(51) Int. Cl.
*H01L 27/12* (2006.01)
*G06F 3/041* (2006.01)
*G02F 1/1333* (2006.01)
*G02F 1/1362* (2006.01)
(Continued)

(52) U.S. Cl.
CPC .......... *H01L 27/124* (2013.01); *G06F 3/0412* (2013.01); *G06F 3/0443* (2019.05); *G06F 3/04164* (2019.05); *G02F 1/13338* (2013.01); *G02F 1/136286* (2013.01); *H01L 27/3276* (2013.01)

(58) Field of Classification Search
None
See application file for complete search history.

(56) References Cited

U.S. PATENT DOCUMENTS

2013/0342779 A1* 12/2013 Jung .................. H01L 33/08
349/43
2020/0235195 A1*  7/2020 Ichikawa ............ H01L 51/56

FOREIGN PATENT DOCUMENTS

JP      2009047902       3/2009
JP      2010054980       3/2010
KR    1020170111827     10/2017
(Continued)

OTHER PUBLICATIONS

PCT International Application No. PCT/KR2019/001162, International Search Report dated Oct. 28, 2019, 12 pages.

*Primary Examiner* — Duane N Taylor, Jr.
(74) *Attorney, Agent, or Firm* — Lee Hong Degerman Kang & Waimey

(57) ABSTRACT

A display device comprises: a display panel including a display area in which TFT wiring is formed and a non-display area in which the TFT wiring is omitted; a touch panel including touch wiring and positioned on the front surface of the display panel; bypass wiring formed in a portion corresponding to the non-display area on the touch panel; and a via of which one end is connected to the end of the TFT wiring, and of which the other end is connected to the bypass wiring, the via being formed in the thickness direction on the display panel and the touch panel, wherein the size of the non-display area in which an optical device is disposed on a display unit can be reduced.

12 Claims, 9 Drawing Sheets

(51) Int. Cl.
*G06F 3/044* (2006.01)
*H01L 27/32* (2006.01)

(56) References Cited

FOREIGN PATENT DOCUMENTS

| KR | 1020170117291 | 10/2017 |
|---|---|---|
| KR | 1020170137230 | 12/2017 |

* cited by examiner

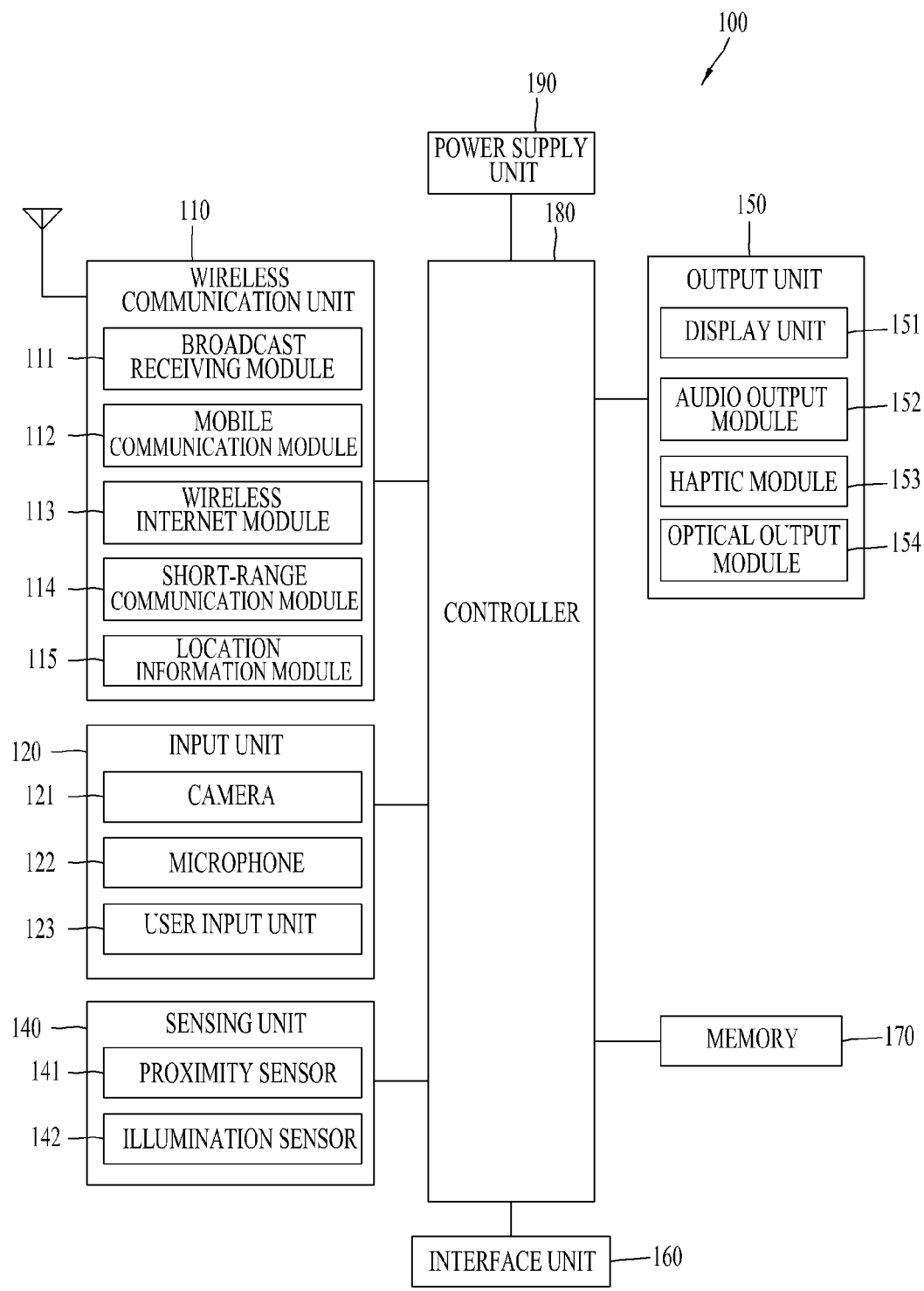

(a)

(b)

(c)

DISPLAY MODULE AND MOBILE TERMINAL

CROSS-REFERENCE TO RELATED APPLICATIONS

This application is the National Stage filing under 35 U.S.C. 371 of International Application No. PCT/KR2019/001162, filed on Jan. 28, 2019, the contents of which is hereby incorporated by reference herein in its entirety.

TECHNICAL FIELD

The present disclosure relates to a display module including an opening defined in a display panel and TFT (Thin Film Transistor) wiring that bypasses the opening, and a mobile terminal having the same.

BACKGROUND ART

A display region of a general display is implemented as a plurality of gate lines and a plurality of data lines vertically intersect each other.

However, following a recent trend toward maximizing the display region, attempts to implement display regions of various shapes are continuing. This includes a case in which electronic components such as a camera hole, a receiver, and the like are disposed in the display region.

Such electronic components are disposed in a non-display region such as a notch in a notch display, a hole in a hole display, or the like.

Because of such region, a region where the gate lines and the data lines are not able to vertically intersect each other occurs on the display. Even when there is a disconnected region in any horizontal or vertical line of the display, normal display output is possible only when wiring is maintained continuously. Therefore, for continuity of the wiring, there is a wiring pattern that bypasses the non-display region of the notch display or the non-display region of the hole display.

In a case of the bypassing wiring pattern, because a space for bypassing wiring must be secured, in addition to a minimum non-display region for disposition of the electronic components, an additional region for wiring bypassing becomes the non-display region. This goes against the recent trend of maximizing the display region of the display.

DISCLOSURE

Technical Problem

The present disclosure aims to provide a display module including an opening defined in a display and TFT (Thin Film Transistor) wiring that bypasses the opening, and a mobile terminal having the same.

Technical Solutions

Provided is a display module including a display panel including a display region with TFT wiring formed therein and a non-display region without the TFT wiring, a touch panel including touch wiring and disposed on a front surface of the display panel, bypassing wiring formed in a portion of the touch panel corresponding to the non-display region, and a via having one end connected to an end of the TFT wiring, and the other end connected to the bypassing wiring, wherein the via is formed in a thickness direction through the display panel and the touch panel.

The non-display region of the display panel may include an opening and a bezel formed around the opening.

The via may be formed on the bezel.

The TFT wiring may include a plurality of TFT lines arranged to be spaced apart from each other by a first spacing, the touch wiring may include a plurality of touch lines arranged to be spaced apart from each other by a second spacing, and the first spacing may be smaller than the second spacing.

The touch panel may include an insulating substrate, a first transparent electrode layer formed on one surface of the insulating substrate, and a second transparent electrode layer formed on a surface opposite to said one surface of the insulating substrate, and the bypassing wiring may be formed on at least one of the first transparent electrode layer and the second transparent electrode layer.

The bypassing wiring may include one of an ITO (Indium Tin Oxide), silver nano, and a carbon nanotube.

A portion of the touch wiring corresponding to the non-display region may be omitted.

Provided is a mobile terminal including a housing, a display panel mounted on a front surface of the housing, wherein the display panel includes a display region with TFT wiring formed therein and a non-display region without the TFT wiring, a touch panel including touch wiring and disposed on a front surface of the display panel, bypassing wiring formed in a portion of the touch panel corresponding to the non-display region, and a via having one end connected to an end of the TFT wiring, and the other end connected to the bypassing wiring, wherein the via is formed in a thickness direction through the display panel and the touch panel.

The non-display region of the display panel may include an opening and a bezel formed around the opening, and the mobile terminal may include an optical component for receiving external light or emitting light to the outside through the opening.

The optical component may be at least partially inserted into the opening.

The non-display region of the display panel may include an opening and a bezel formed around the opening, and the via may be formed on the bezel.

The TFT wiring may include a plurality of TFT lines arranged to be spaced apart from each other by a first spacing, the touch wiring may include a plurality of touch lines arranged to be spaced apart from each other by a second spacing, and the first spacing may be smaller than the second spacing.

The touch panel may include an insulating substrate, a first transparent electrode layer formed on one surface of the insulating substrate, and a second transparent electrode layer formed on a surface opposite to said one surface of the insulating substrate, and the bypassing wiring may be formed on at least one of the first transparent electrode layer and the second transparent electrode layer.

Advantageous Effects

An effect of the mobile terminal according to the present disclosure will be described as follows.

According to at least one of the embodiments of the present disclosure, a size of the non-display region in which an optical device is disposed on the display unit may be reduced.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

DESCRIPTION OF DRAWINGS

FIG. 1A is a block diagram of a mobile terminal in accordance with the present disclosure.

BEST MODE

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
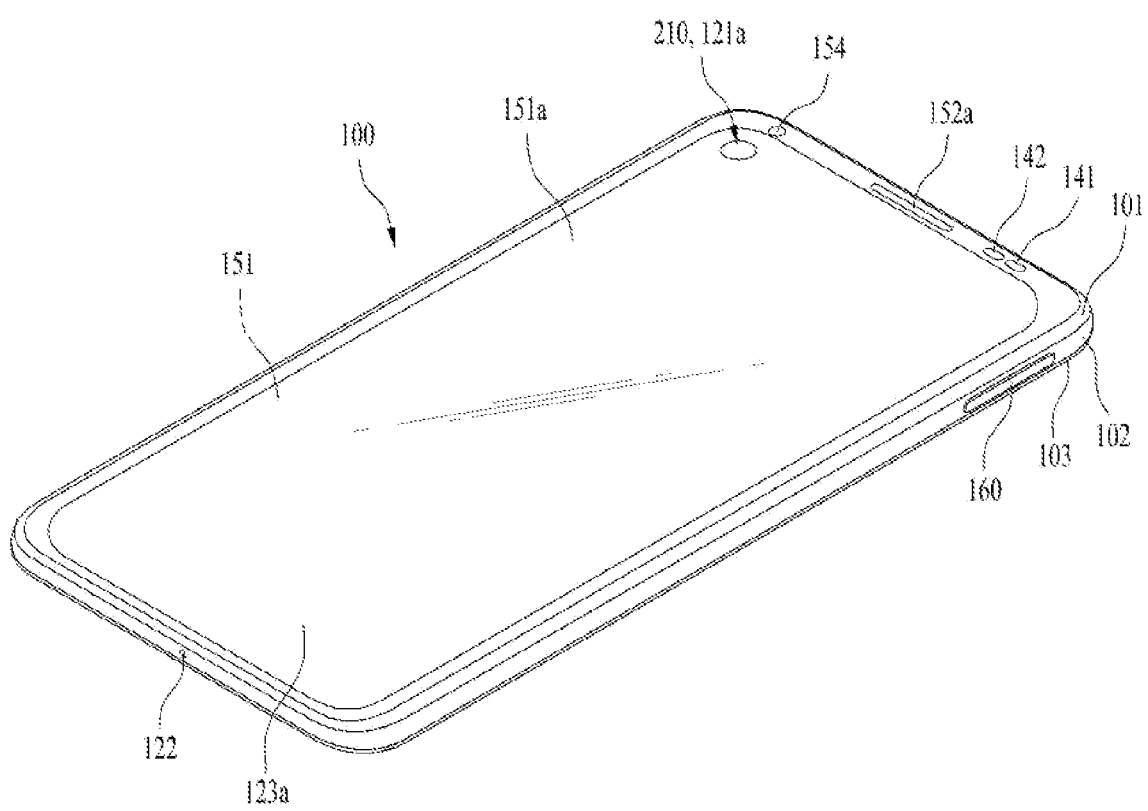
FIGS. 1B and 1C are conceptual views of one example of the mobile terminal, viewed from different directions.
Figure 1C:
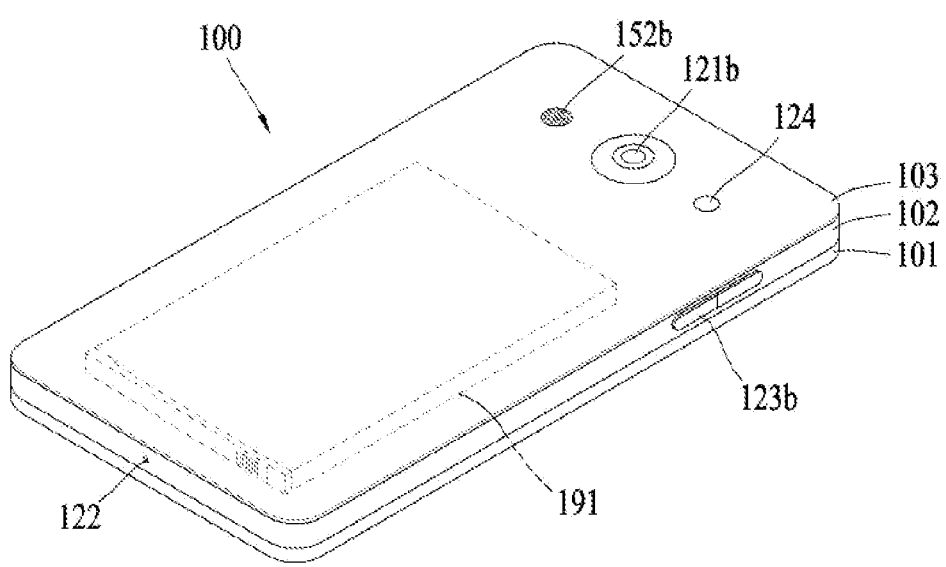

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. Referring now to FIG. 1A, the mobile terminal 100 is shown having wireless communication unit 110 configured with several commonly implemented components. It is understood that implementing all of the illustrated components is not a requirement, and that greater or fewer components may alternatively be implemented.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1A. Moreover, the controller 180 may be implemented to combinedly operate two or more of the components provided in the mobile terminal 100 to drive the application programs.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

Here, the terminal body may be understood to refer to the concept of this bore a mobile terminal (100) to at least one of the aggregate.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include the display unit 151, the first and second audio output modules 152a and 152b, the proximity sensor 141, the illuminance sensor 142, the optical output module 154, the first and second cameras 121a and 121b, the first and second manipulation units 123a and 123b, the microphone 122 and the interface unit 160.

It will be described for the mobile terminal as shown in FIGS. 1B and 1C. The display unit 151, the first audio output module 152a, the proximity sensor 141, an illumination sensor 142, the optical output module 154, the first camera 121a and the first manipulation unit 123a are arranged in front surface of the terminal body, the second manipulation unit 123b, the microphone 122 and interface unit 160 are arranged in side surface of the terminal body, and the second audio output modules 152b and the second camera 121b are arranged in rear surface of the terminal body.

It is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

A flash 124 is shown located adjacent to the second camera 121b. When an image of a subject is captured with the camera 121b, the flash 124 may illuminate the subject.

The second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 (see FIG. 1A). may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

The display unit 151, the front surface camera 121a, the proximity sensor 141, the receiver 152a, the optical output module 154, and the like are disposed on a front surface of the mobile terminal 100. Conventionally, the front surface camera 121a, the proximity sensor 141, the receiver 152a, the optical output module 154, and the like are disposed around the display unit 151.

However, in the recent mobile terminal 100, in order to minimize a region around the display unit and maximize the display unit 151, a form in which an opening 211 is defined by omitting a portion of the display unit 151 like a hole in the display unit 151 as shown in FIG. 2, or a notch is defined in the display unit 151 and front surface mounting parts are placed in the notch is emerging.

In addition to the opening 211 for the front surface parts such as the actual camera 121a and the like, a sealing structure 212 for covering a layered structure of a display panel exposed through a side surface of the opening 211 is required. Because the sealing structure does not substantially output an image, a non-display region 210 includes the opening 211 and a region of a bezel 212 including the sealing structure.

As shown in FIG. 1B, the proximity sensor 141, the receiver 152a, the optical output module 154, and the like may be omitted, may be removed from the front surface using a method for disposing the same at different locations, or may be mounted at an upper portion even when a size of the display unit 151 is increased because of a small area occupied on the front surface. However, the front surface camera has become an essential component in a situation where filming of self-camera 121a is common. In addition, because the camera has a larger size compared to other front surface components, it is difficult to dispose the camera at an upper end portion of the extended display unit 151.

Therefore, because the camera is a representative component disposed in the non-display region 210 of the display unit 151, the camera that films the image through the opening 211 will be described below as a reference. However, the proximity sensor, the optical output module, and the like may be disposed in the opening 211 as well as the camera 121a.

Figure 1D:
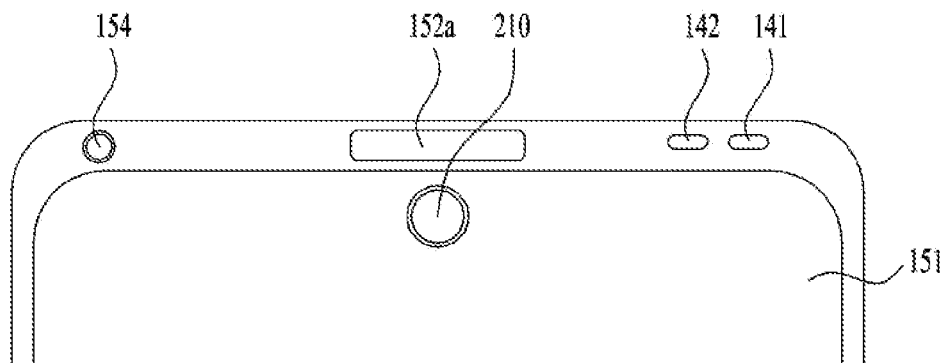
FIG. 1D is a front view showing another example of a mobile terminal in accordance with the present disclosure.
Figure 1D:
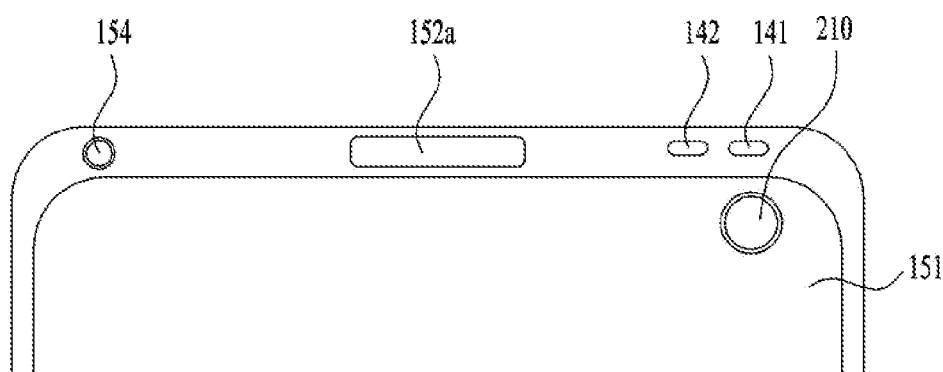
Figure 1D:
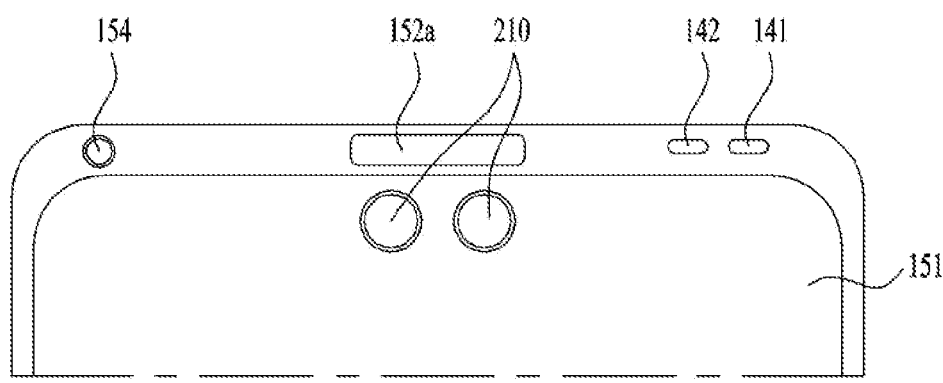

FIG. 1D is a front view showing another example of a mobile terminal in accordance with the present disclosure. The non-display region 210 may be located at a top left portion of the display unit 151 as shown in FIG. 1B, but may be located at a top center portion as shown in (a) in FIG. 1D or at a top right portion as shown in (b) in FIG. 1D. In order to mount a plurality of cameras 121 or to additionally mount parts other than the camera inwardly of the display unit 151, a plurality of non-display regions 210 may be included as shown in (c) in FIG. 1D. In addition to the illustrated embodiment, the non-display region 210 may be freely disposed at a location such as a lower portion, a center portion, or the like.

The display unit 151 includes a display panel that outputs an image and a touch panel 144 formed on the display panel. A liquid crystal panel and an organic light emitting diode panel are the most used as the display panel, and both types realize a desired color by applying a voltage to each pixel.

Pixels are arranged in a grid shape along x-axis and y-axis. A thin film transistor (TFT) is used to control the voltage applied to each pixel. The TFT includes TFT wiring 221 including a plurality of orthogonal lines formed on a substrate. The TFT wiring 221 is composed of a plurality of gate lines 221a extending in a first direction and a plurality of data lines 221b extending in a second direction orthogonal to the first direction. A point where each gate line 221a and each data line 221b intersect each other becomes one pixel. In order to distinguish between the gate line 221a and the data line 221b of the TFT wiring 221, an insulating material may be interposed between the gate line 221a and the data line 221b.

Because the TFT wiring 221 of the display unit 151 is made of a conductive material, there is a problem in that it is difficult to acquire a clear image when the TFT wiring 221 is disposed on a front surface of the camera 121a or the like. In addition, because each layer of the display unit 151 is colored or opaque, when an optical device such as the camera 121a or the like is disposed on a rear surface of the display unit 151, there is a problem that a performance of the optical device is deteriorated. Therefore, it is necessary to bypass the TFT wiring 221 avoiding the front surface of the camera.

Figure 2A:
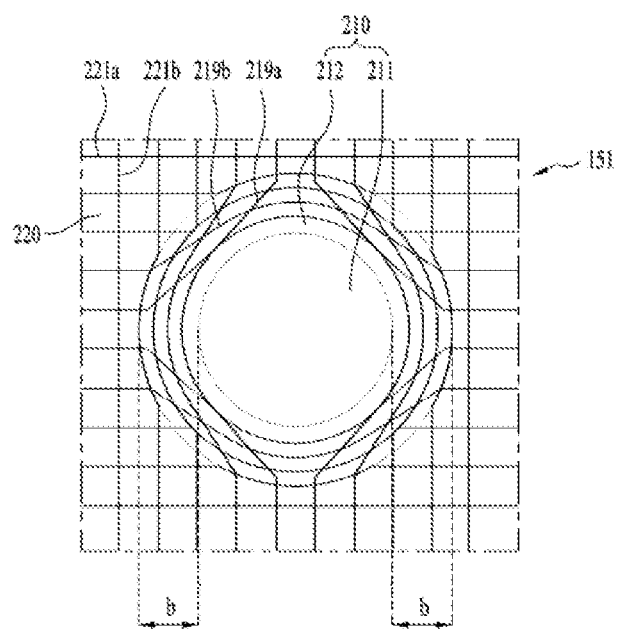
FIGS. 2A and 2B are diagrams for illustrating a method for bypassing the TFT wiring in the conventional non-display region.
Figure 2B:
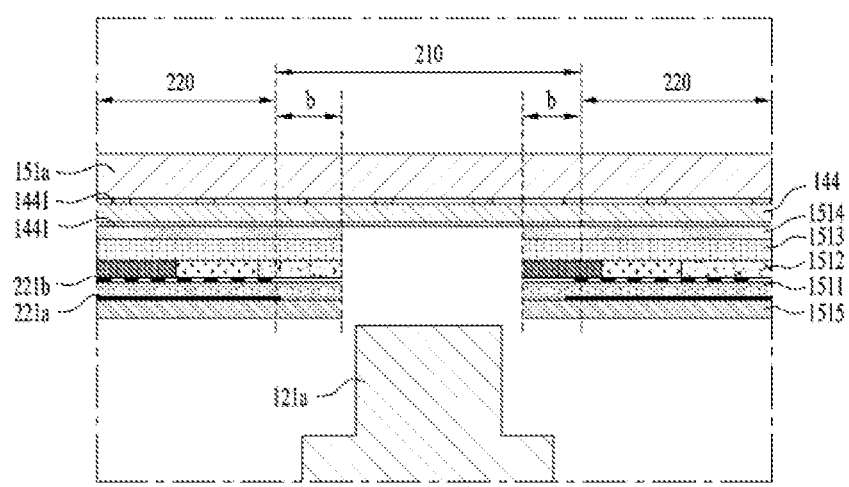

FIGS. 2A and 2B are diagrams for illustrating a method for bypassing the TFT wiring 221 in the conventional non-display region 210. FIG. 2A is a diagram showing a display panel in the non-display region 210, and FIG. 2B is a cross-sectional diagram of the non-display region 210.

The TFT wiring 221 formed in the grid shape is disconnected in the non-display region 210. A disconnected portion of the TFT wiring 221 may be connected to the remaining portion through bypassing wiring 219a and 219b formed along the opening 211 as shown in FIG. 2A. Even when the bypassing wiring 219a and 219b is densely formed, the bypassing wiring 219a and 219b occupies a predetermined space, so that a size b of the bezel 212 around the opening 211 increases as much as a mounting region 213 of the bypassing wiring 214.

When a size of the non-display region 210 other than the opening 211 actually required increases, there is a problem in that a size of the display region 220 is reduced and the effectiveness of substantially expanding the display unit 151 is reduced. Thus, in order to reduce the size of the bezel 212, the present disclosure uses a portion of the touch sensor.

Figure 3A:
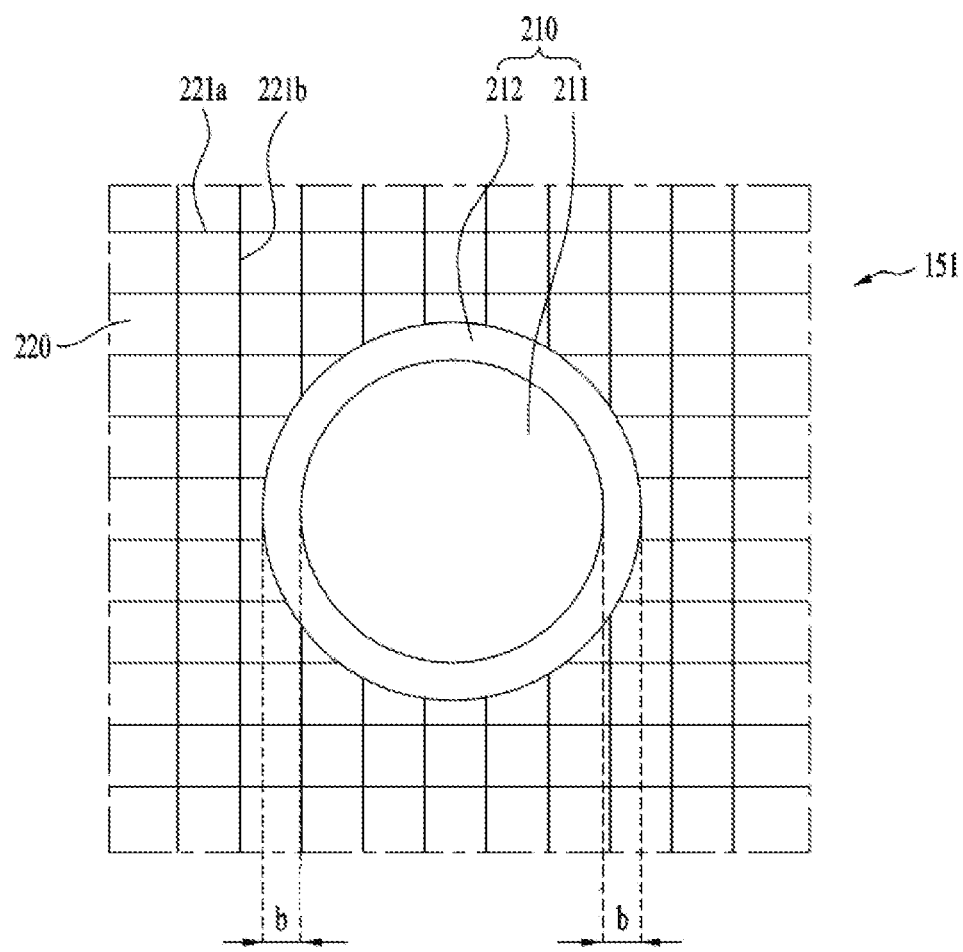
FIG. 3A is a view showing a TFT sensor of the non-display region of the display panel of the present disclosure.
Figure 3B:
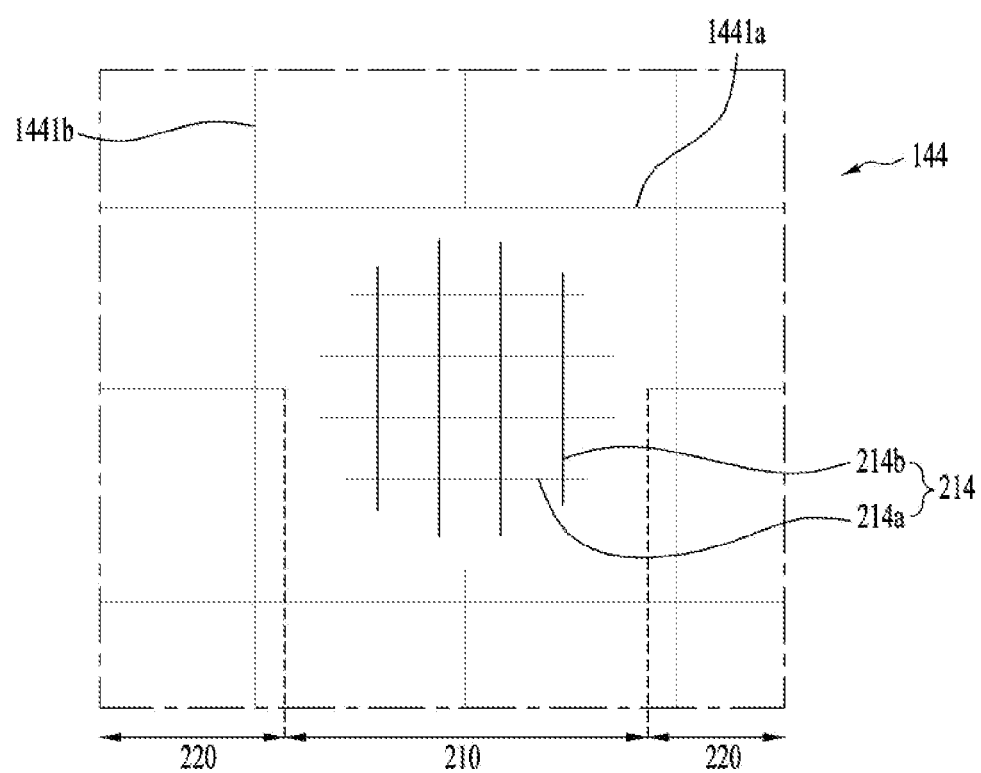
FIG. 3B is a view showing touch wiring of the non-display region of the touch panel of the present disclosure.

FIG. 3A is a view showing a TFT sensor of the non-display region 210 of the display panel of the present disclosure, and FIG. 3B is a view showing touch wiring 1441 of the non-display region 210 of the touch panel 144 of the present disclosure.

The touch sensor includes the touch wiring 1441 forming a grid, and includes a Tx line 1441a to which power is applied, and an Rx line 1441b formed in a vertical direction to the Tx line 1441a and intersecting the Tx line 1441a. The Tx line 1441a and the Rx line 1441b do not directly contact with each other, and an insulating material is interposed therebetween to form a capacitor at an intersection of the Tx line 1441a and the Rx line 1441b. When a user touches the touch panel 144 with hand or a stylus pen, as a capacitance at the intersection between the Tx line 1441a and the Rx line 1441b changes, the touch of the user may be recognized as a touch input.

Because the touch wiring 1441 of the touch sensor uses a transparent electrode such as an ITO (Indium Tin Oxide), the touch wiring 1441 does not significantly affect resolution of the camera even when being formed in a non-output portion. Thus, although it is possible to not omit the touch wiring 1441 in the non-display region 210 as shown in FIG. 2B, the present disclosure omits the touch wiring 1441 in the non-display region 210.

Because the touch wiring 1441 has a greater spacing than the TFT wiring 221 and there is no need to sync the pixels unlike the display panel, even when the touch wiring 1441 is omitted from the non-display region 210, there is no difficulty in recognizing the touch input of the user even when the separate bypassing wiring 214 is not formed.

The present disclosure may reduce the size of the bezel 212 around the opening 211 by omitting the touch wiring 1441 in the non-display region 210, and forming the bypassing wiring 214 of the TFT wiring 221 using the region where the touch wiring 1441 is omitted.

As shown in FIG. 3A, the TFT wiring 221 is disconnected in the non-display region 210. As shown in FIG. 3B, the bypassing wiring 214 may be formed in the region where the touch wiring 1441 of the touch panel 144 is omitted.

Figure 4A:
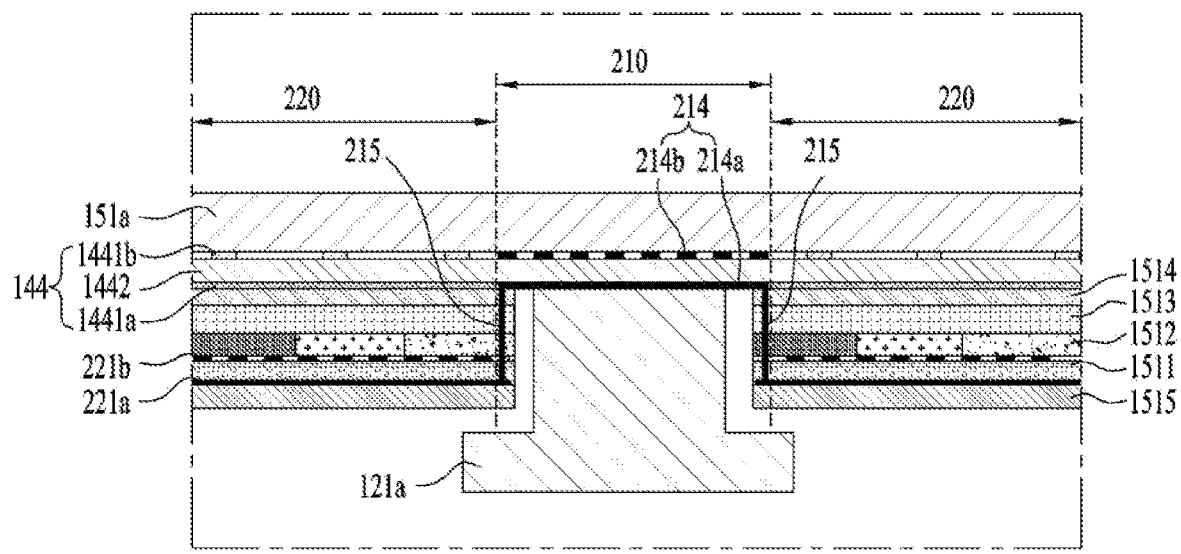
FIGS. 4A and 4B are diagrams showing cross-sections of the display unit.
Figure 4B:
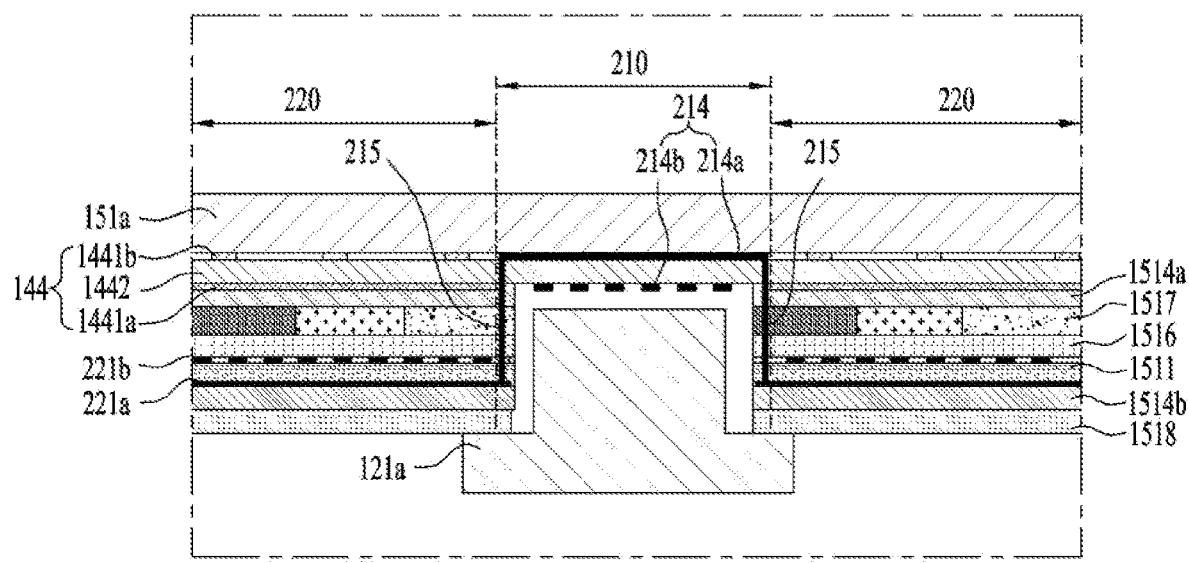

FIGS. 4A and 4B are diagrams showing cross-sections of the display unit 151, FIG. 4A shows an organic light emitting diode panel and FIG. 4B shows a liquid crystal panel. The organic light emitting diode panel has a structure in which a TFT wiring layer 1511, an organic layer 1512 formed on the TFT wiring layer 1511, an encapsulating layer 1513 encapsulating the organic layer 1512, and a polarization layer 1514 are sequentially stacked. A back plate 1515 for supporting the layered structure is included on a rearmost surface. A thin polyimide film or the like may be used for the back plate 1515. A touch panel 144 having a touch wiring 1441 formed thereon is stacked on a front surface of the touch panel 144. A window attached to the front surface of the display unit 151 protects the display unit 151 and forms an exterior of the front surface of the mobile terminal 100.

The opening 211 is defined in the touch panel 144 of the display unit 151 having such a layered structure such that a lens of the camera may collect the image. Because the organic layer 1512 or the TFT wiring layer 1511 may deteriorate a quality of the image input to the camera, the opening 211 is defined as shown in FIG. 4A.

In order to connect the TFT wiring 221 in FIG. 3A and the bypassing wiring 214 in FIG. 3B, a via 215 passing through the display panel may be formed as shown in FIG. 4A. The via 215 is disposed on the bezel 212 positioned around the opening 211, one end of the via 215 is connected to the TFT wiring 221 and the other end thereof is connected to the bypassing wiring 214 formed on the touch panel 144.

Figure 5:
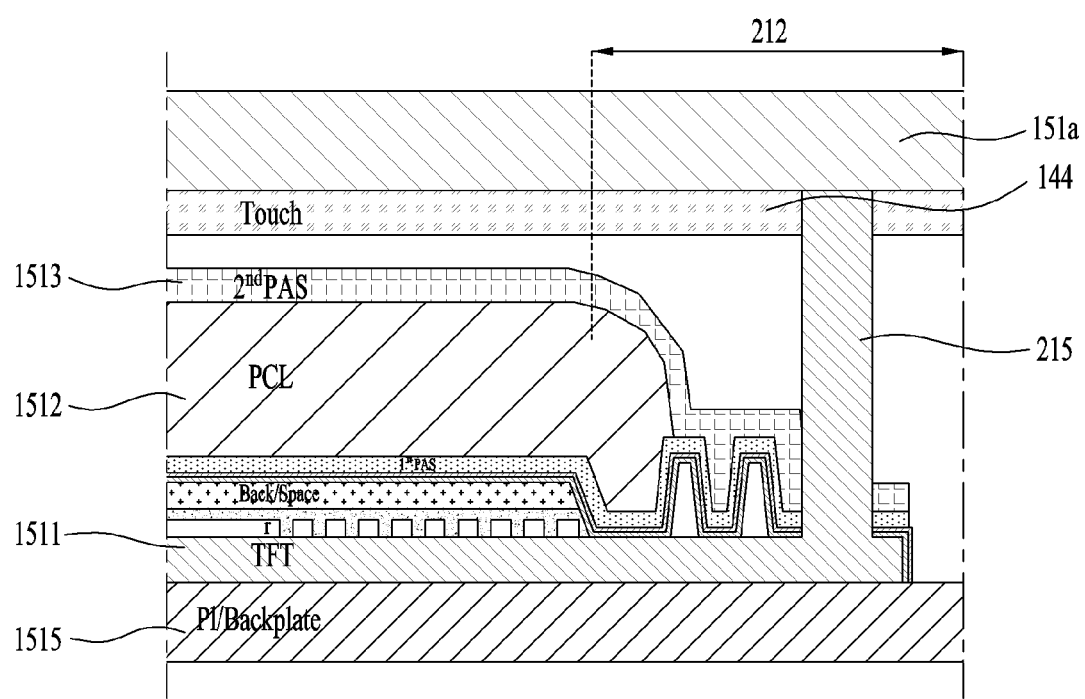
FIG. 5 is a diagram showing a boundary between the non-display region and the display region of the organic light emitting diode panel in FIG. 4A.

FIG. 5 is a diagram showing a boundary between the non-display region 210 and the display region 220 of the organic light emitting diode panel in FIG. 4A. The organic light emitting diode panel includes the organic layer 1512 stacked on the TFT wiring layer 1511, and applies an electrical signal to the organic layer 1512 to output color for each pixel. Because the encapsulating layer 1513 must cover the organic layer 1512 such that the organic layer 1512 is not exposed to the air, a region where the encapsulating layer 1513 covers the organic layer 1512 is located on the bezel 212. The via 215 may be formed on the bezel 212 to be connected to the bypassing wiring 214 formed on the touch panel 144. FIG. 4B shows an embodiment of a display panel that is the liquid crystal panel. The liquid crystal panel has a layered structure in which the TFT wiring layer 1511, a liquid crystal layer 1516, a color filter 1517, and a polarization layer 1514a are stacked. Unlike the organic light emitting diode panel, the liquid crystal panel is not able to emit light by itself, and thus, includes a backlight unit 1518 that supplies light. The backlight unit 1518 may further include a polarization layer 1514b to supply light supplied from a light source to the liquid crystal layer 1516 positioned on the front surface and to supply uniform light.

The liquid crystal panel also includes the TFT wiring layer 1511 like the organic light emitting diode panel. The TFT wiring 221 may be disconnected in the non-display region 210, and portions of the TFT wiring 221 opposite around the non-display region 210 may be connected to each other through the via 215 and the bypassing wiring 214.

A via hole may be defined around the opening 211 of the display panel, and the via 215 may be formed by filling the via hole with a material with high conductivity such as silver or copper. The bypassing wiring 214 may be formed using a material such as an ITO that forms the touch wiring 1441 on the touch panel 144, and a transparent electrode may be formed using a conductive material having small particles, such as silver nano or carbon nanotube.

In order to prevent the orthogonal Tx line 1441a and the Rx line 1441b from coming into contact with each other, in the touch panel 144, one of the Tx line 1441a or the Rx line 1441b may be omitted at the intersection, a bridge may be formed on an opposite side of an insulating substrate 1442 to connect the Tx line 1441a and the Rx line 1441b with each other through the bridge. Alternatively, the Tx line 1441a and the Rx line 1441b may be formed on opposite sides with the insulating substrate 1442 interposed therebetween.

The bypassing wiring 214 may also form bypassing wiring 214a connected to the gate line 221a and bypassing wiring 214b connected to the data line 221b respectively on one surface and a surface opposite to said one surface of the insulating substrate 1442 such that both the bypassing wiring 214a and the bypassing wiring 214b are formed on the touch panel 144. In this case, the via 215 may extend through not only the display panel but also a layered structure underneath the touch panel 144.

The optical device such as the camera 121a may be inserted into the opening 211 as shown in FIG. 4 to secure a space inside the mobile terminal 100.

As described above, according to at least one of the embodiments of the present disclosure, the size of the non-display region may be reduced, so that the size of the display region may be increased.

It is obvious to those skilled in the art that the present disclosure may be embodied in other specific forms without departing from the spirit and essential characteristics of the present disclosure.

The scope of the present disclosure should be determined by a reasonable interpretation of the appended claims, and any changes within the equivalent scope of the present disclosure are included in the scope of the present disclosure.

What is claimed is:

1. A display module comprising:
a display panel including a display region with TFT (thin film transistor) wiring formed therein and a non-display region without the TFT wiring, wherein the TFT wiring is disconnected in the non-display region;
a touch panel disposed on a front surface of the display panel, wherein the touch panel includes touch wiring formed in a portion corresponding to the display region of the display panel and bypassing wiring formed in a portion of the touch panel corresponding to the non-display region; and
via passages formed in a thickness direction through the display panel and the touch panel to connect between an end of the disconnected TFT wiring and an end of the bypassing wiring,
wherein the disconnected TFT wiring is connected through the via passages to the end of the bypassing wiring.

2. The display module of claim 1, wherein the non-display region of the display panel includes an opening and a bezel formed around the opening.

3. The display module of claim 2, wherein the via passages are formed on the bezel.

4. The display module of claim 1, wherein the TFT wiring includes a plurality of TFT lines arranged to be spaced apart from each other by a first spacing,
wherein the touch wiring includes a plurality of touch lines arranged to be spaced apart from each other by a second spacing,
wherein the first spacing is smaller than the second spacing.

5. The display module of claim 1, wherein the touch panel includes:
an insulating substrate;
a first transparent electrode layer formed on one surface of the insulating substrate; and
a second transparent electrode layer formed on a surface opposite to said one surface of the insulating substrate,
wherein the bypassing wiring is formed on at least one of the first transparent electrode layer or the second transparent electrode layer.

6. The display module of claim 1, wherein the bypassing wiring includes one of an ITO (Indium Tin Oxide), silver nano, or a carbon nanotube.

7. A mobile terminal comprising:
a housing;
a display panel mounted on a front surface of the housing, wherein the display panel includes a display region with TFT (thin film transistor) wiring formed therein and a non-display region without the TFT wiring, wherein the TFT wiring is disconnected in the non-display region;
a touch panel disposed on a front surface of the display panel, wherein the touch panel includes touch wiring formed in a portion corresponding to the display region of the display panel and bypassing wiring formed in a portion of the touch panel corresponding to the non-display region; and
via passages formed in a thickness direction through the display panel and the touch panel to connect between an end of the disconnected TFT wiring and an end of the bypassing wiring,
wherein the disconnected TFT wiring is connected through the via passages to the end of the bypassing wiring.

8. The mobile terminal of claim 7, wherein the non-display region of the display panel includes an opening and a bezel formed around the opening,
wherein the mobile terminal includes an optical component for receiving external light or emitting light to an outside through the opening.

9. The mobile terminal of claim 8, wherein the optical component is at least partially inserted into the opening.

10. The mobile terminal of claim 7, wherein the non-display region of the display panel includes an opening and a bezel formed around the opening,
 wherein the via passages are formed on the bezel.

11. The mobile terminal of claim 7, wherein the TFT wiring includes a plurality of TFT lines arranged to be spaced apart from each other by a first spacing,
 wherein the touch wiring includes a plurality of touch lines arranged to be spaced apart from each other by a second spacing,
 wherein the first spacing is smaller than the second spacing.

12. The mobile terminal of claim 1, wherein the touch panel includes:
 an insulating substrate;
 a first transparent electrode layer formed on one surface of the insulating substrate; and
 a second transparent electrode layer formed on a surface opposite to said one surface of the insulating substrate,
 wherein the bypassing wiring is formed on at least one of the first transparent electrode layer or the second transparent electrode layer.

\* \* \* \* \*